United States Patent
O'Connor et al.

(10) Patent No.: US 10,901,839 B2
(45) Date of Patent: Jan. 26, 2021

(54) COMMON HIGH AND LOW RANDOM BIT ERROR CORRECTION LOGIC

(71) Applicant: International Business Machines Corporation, Armonk, NY (US)

(72) Inventors: James A. O'Connor, Ulster Park, NY (US); Barry M. Trager, Yorktown Heights, NY (US); Warren E. Maule, Cedar Park, TX (US); Brad W. Michael, Cedar Park, TX (US); Marc A. Gollub, Travis, TX (US); Patrick J. Meaney, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/142,440

(22) Filed: Sep. 26, 2018

(65) Prior Publication Data

US 2020/0097359 A1 Mar. 26, 2020

(51) Int. Cl.
*G11C 29/52* (2006.01)
*G06F 11/10* (2006.01)

(52) U.S. Cl.
CPC .......... *G06F 11/1068* (2013.01); *G11C 29/52* (2013.01)

(58) Field of Classification Search
None
See application file for complete search history.

(56) References Cited

U.S. PATENT DOCUMENTS

| 7,103,830 B1 | 9/2006 | Dong |
| 7,225,390 B2 | 5/2007 | Ito et al. |
| 7,305,518 B2 | 12/2007 | Zeighami et al. |
| 7,320,100 B2 * | 1/2008 | Dixon ............ G06F 11/106 |
| | | 714/718 |
| 7,565,593 B2 * | 7/2009 | Dixon ............ G06F 11/106 |
| | | 714/754 |
| 7,676,728 B2 * | 3/2010 | Resnick ............ G06F 11/106 |
| | | 711/105 |

(Continued)

FOREIGN PATENT DOCUMENTS

| CN | 107608817 A | 1/2018 |
| CN | 107731259 A | 2/2018 |

OTHER PUBLICATIONS

Sarwate et al., "High Speed Architectures for Reed-Solomon Decoders" IEEE, vol. 9, No. 5, Oct. 2001, 15 pages.

(Continued)

*Primary Examiner* — Phung M Chung
(74) *Attorney, Agent, or Firm* — Cantor Colburn LLP; Bryan Bortnick

(57) ABSTRACT

Embodiments of the present invention include a memory module that includes a plurality of memory devices and a memory buffer device. The memory devices are characterized as one of a high or low random bit error rate (RBER) memory device. The memory buffer device includes a read data interface to receive data read from a memory address on one of the memory devices, and common error correction logic to detect and correct error conditions in data read from both high RBER and low RBER memory devices. The memory buffer device also includes refresh rate logic configured to adjust a refresh rate based on the detected error conditions.

20 Claims, 12 Drawing Sheets

(56) References Cited

U.S. PATENT DOCUMENTS

| | | | |
|---|---|---|---|
| 8,024,638 B2* | 9/2011 | Resnick | G06F 11/106 365/189.04 |
| 8,347,176 B2* | 1/2013 | Resnick | G06F 11/106 714/752 |
| 8,887,014 B2 | 11/2014 | Franceschini et al. | |
| 9,087,612 B2 | 7/2015 | Franceschini et al. | |
| 9,685,217 B2 | 6/2017 | Romanovskyy et al. | |
| 10,372,531 B2 | 8/2019 | Prathapan | |
| 2005/0022065 A1* | 1/2005 | Dixon | G11C 29/44 714/42 |
| 2007/0047344 A1 | 3/2007 | Thayer | |
| 2007/0113150 A1* | 5/2007 | Resnick | G06F 11/106 714/763 |
| 2007/0162826 A1* | 7/2007 | Major | H03M 13/03 714/763 |
| 2008/0163032 A1 | 7/2008 | Lastras-Montano | |
| 2010/0005220 A1 | 1/2010 | Loughner | |
| 2010/0332942 A1 | 12/2010 | Wezelenburg | |
| 2012/0226963 A1 | 9/2012 | Bivens | |
| 2013/0198587 A1 | 8/2013 | Kim et al. | |
| 2014/0237319 A1 | 8/2014 | Seo | |
| 2015/0121166 A1 | 4/2015 | Goodman | |
| 2015/0121167 A1 | 4/2015 | Goodman | |
| 2017/0147431 A1 | 5/2017 | West et al. | |
| 2017/0256302 A1 | 9/2017 | Ling | |
| 2018/0046373 A1 | 2/2018 | Xiong | |
| 2019/0317856 A1 | 10/2019 | O'Connor | |
| 2020/0192749 A1* | 6/2020 | Richter | G06F 11/1004 |

OTHER PUBLICATIONS

Yingquan Wu, New Scalable Decoder Architectures for Reed-Solomon Codes, IEEE, vol. 63, No. 8, Aug. 2015, 21 pages.

International Search Report and Written Opinion for International Application No. PCT/IB2019/052691, International Filing Date: Apr. 2, 2019, dated Aug. 20, 2019; 9 pages.

List of IBM Patents or Patent Applictions Treated As Related; (Appendix P), filed Jun. 8, 2020, 2 pages.

* cited by examiner

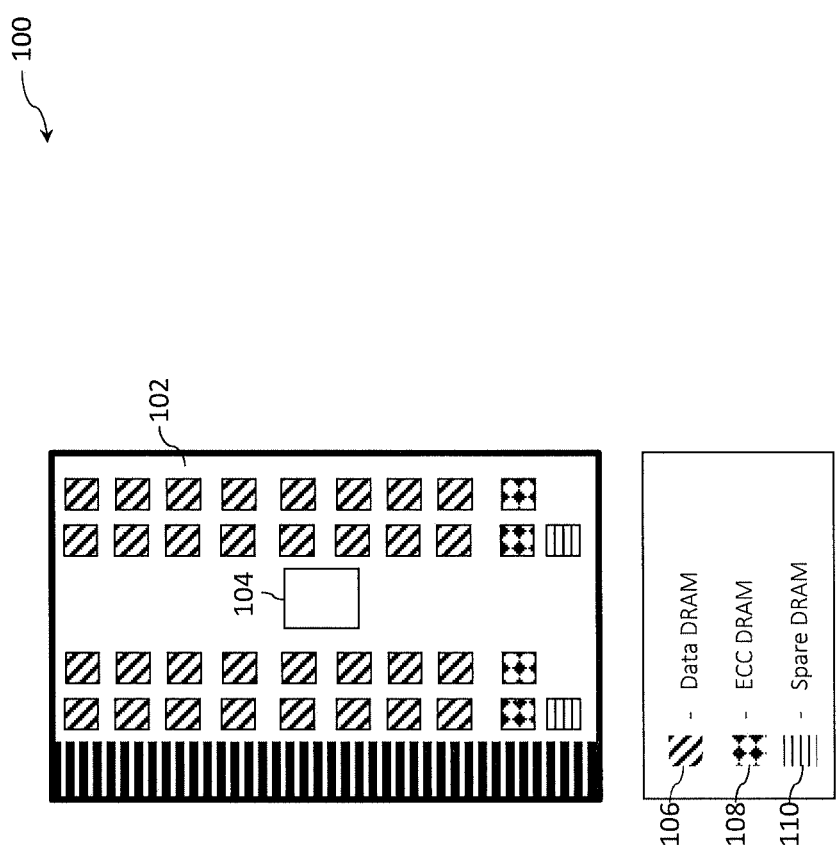

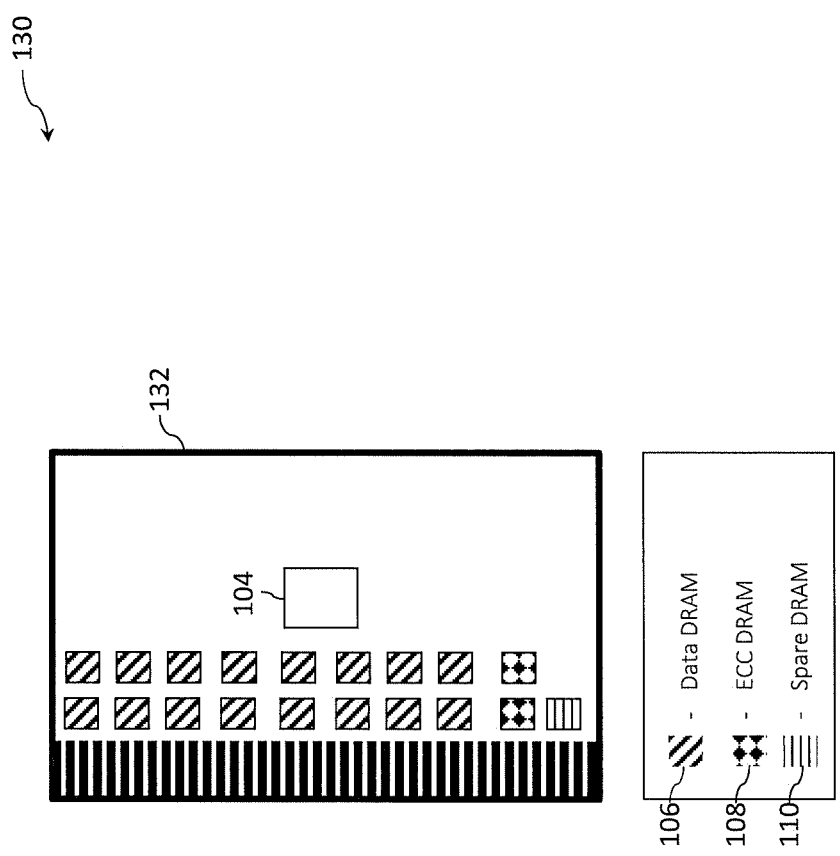

| Exit | | Cycles | Estimated Frequency of Occurrence |
|---|---|---|---|
| Exit 0 | Bypass | 0 cycles | All the Time |
| Exit 1 | 1 chip kill with mark + 1 random symbol | 8 cycles | A few a day All the time with a chip kill |
| Exit 2 | 1 unmarked chip kills and 1 marked symbol | 12 cycles | Rare |

FIG. 2

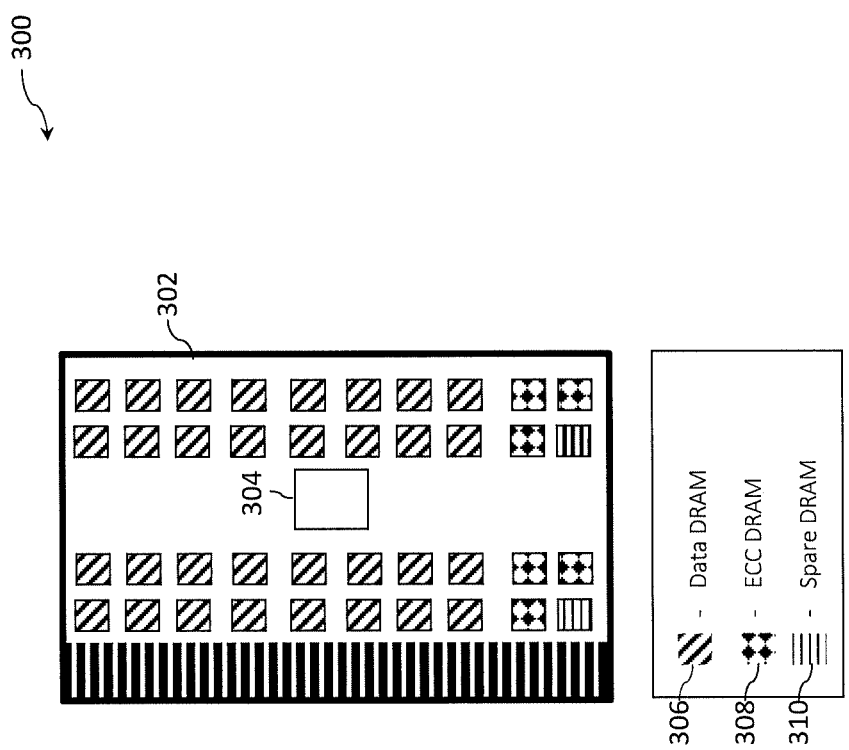

| 408 | | 410 | 411 | 412 |
|---|---|---|---|---|
| Exit | | Cycles | Frequency of Occurrence with High RBER DRAM | Frequency of Occurrence with Low BER DRAM |
| Exit 0 | Bypass | 0 cycles | All the Time | All the Time |
| Exit 1 | 1 or 2 Symbols | 15-16 Cycles | microseconds | A few a day |
| Exit 2 | 1 marked chip kill + 3-4 symbols | 22-25 cycles | A few a second & all the time with a chip kill with mark | Rare All the time with a chip kill, but spare resolves that |
| Exit 3 | 1 marked chip kill + 9 symbols | 32-35 cycles | Hourly All the time with 1 marked chip kill | Rare |

404 — Exit 1 row
405 — Exit 2 row
406 — Exit 3 row

| Data Symbols | ECC Symbols | Total Symbols | Max Number of Correctable Symbol Faults | Bit Error Rate | 1 Symbol Errors per Micro Second | 2 Symbol Errors per Milli Second | 3 Symbol Errors per Second | 4 Symbol Errors per Minute | 5 Symbol Errors per Day | 6 Symbol Errors per Year | 7 Symbol Errors per Year | 8 Symbol Errors per 1000 Years |
|---|---|---|---|---|---|---|---|---|---|---|---|---|
| 64 | 8 | 72 | 4 | 1E-20 | Years | | | | | | | |
| 128 | 16 | 144 | 8 | 1E-20 | Years | | | | | | | |
| 64 | 8 | 72 | 4 | 1E-5 | 21 | 59 | 109 | 9 | 14 | 5 | 0.003 | 0.002 |
| 64 | 16 | 80 | 8 | 1E-5 | 23 | 73 | 150 | 14 | 24 | 9 | 0.01 | 0.01 |
| 128 | 16 | 144 | 8 | 1E-5 | 20 | 118 | 443 | 75 | 242 | 164 | 0.26 | 0.35 |
| 128 | 24 | 152 | 12 | 1E-5 | 21 | 130 | 511 | 91 | 308 | 219 | 0.36 | 0.52 |
| 128 | 32 | 160 | 16 | 1E-5 | 23 | 145 | 609 | 115 | 412 | 311 | 0.55 | 0.84 |

COMMON HIGH AND LOW RANDOM BIT ERROR CORRECTION LOGIC

BACKGROUND

Embodiments of the present invention relate in general to computer memory, and more specifically to providing common high and low random bit error correction logic.

SUMMARY

Embodiments of the present invention include methods, systems, and computer program products for providing common high and low random bit error correction logic. A non-limiting example system includes a memory system that includes a memory module that includes a plurality of memory devices and a memory buffer device. Each of the plurality of memory devices is assigned a refresh rate and is characterized as one of a high random bit error rate (RBER) memory device and a low RBER memory device. The memory buffer device includes a read data interface configured to receive data read from a memory address corresponding to a location on a memory device of the plurality of memory devices. The memory buffer device also includes common error correction logic configured to detect and correct error conditions in data read from both high RBER memory devices and low RBER memory devices. The memory buffer further includes refresh rate logic configured to adjust a refresh rate in the memory device based at least in part on the error conditions detected by the common error correction logic.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1A depicts a contemporary memory system that includes a dual in-line memory module (DIMM);

FIG. 1B depicts a contemporary memory system that includes a dual in-line memory module (DIMM);

FIG. 2 depicts a table of error correcting actions in a contemporary memory system;

FIG. 3A depicts a memory system that includes a DIMM in accordance with one or more embodiments of the present invention;

FIG. 4 depicts a table of error correction actions performed by error correction logic in accordance with one or more embodiments of the present invention;

FIG. 7 depicts different combinations of data symbols and error correcting code (ECC) symbols in accordance with one or more embodiments of the present invention;

Figure 3B:
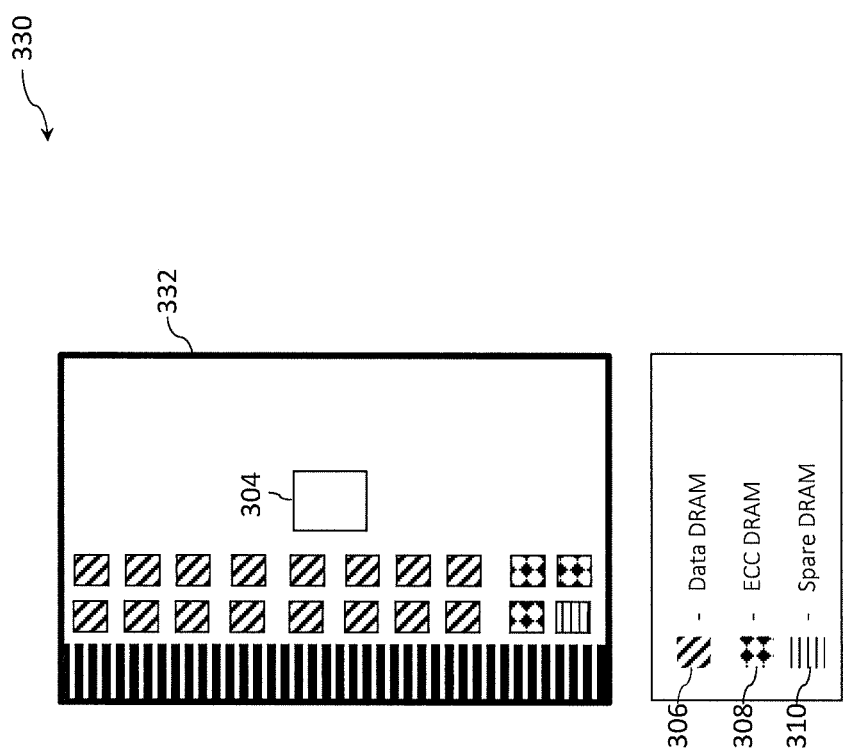
FIG. 3B depicts a memory system that includes a DIMM in accordance with one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Recent advances in dynamic random access memory (DRAM) device design and fabrication as well other types of innovative storage devices have resulted in some technologies with far higher random bit error rates (RBERs) than those encountered with traditional DRAM devices. For example, traditional, low RBER DRAM devices may have RBERs in the range of about 1E-20 and the newer technologies may exhibit more frequent random bit errors and have RBERs in the range of about 1E-5. When using a DRAM or other storage technology with a high RBER the occurrence of symbol errors in a cache line is no longer an extremely rare phenomenon, as bit and symbol errors may be encountered regularly. Errors may be encountered as often as every microsecond of operation or even every sub-microsecond for a system with a clock frequency greater than three gigahertz (GHz). This would result in one symbol error as frequently as every seventy-five cycles. It is expected that in some situations memory devices with high RBERs will be utilized and in other cases memory devices with low RBERs will continue to be utilized.

Embodiments of the present invention provide a common random bit error, or random symbol error, correction scheme that minimizes a performance impact of error checking and correcting, for both memory devices that exhibit high RBERs as well as memory devices that exhibit low RBERs. The common error correction design described herein, which may be implemented by common error correction logic (hardware and/or software), can be utilized for both high RBER memory devices and low RBER memory devices while minimizing a performance impact on dynamic random access memory (DRAM) operation. Any high RBER memory device can be implemented by embodiments described herein such as, but not limited to: a Managed DRAM Solution (MDS) DRAM from SK Hynix and a NAND flash device (whose bit error rate increases rapidly once the write endurance limit is reached). Similarly, any low RBER memory device can be implemented by embodiments described herein such as, but not limited to: double data rate (DDR) memory devices such as DDR3, DDR4, and DDR5 as well as magnetic platters associated with HDDs. The ability to use the same error correction logic for both high and low RBER memory devices provides flexibility by allowing memory devices of any RBER to be installed on the memory module and interoperate with a common memory control/buffer chip. What constitutes a high RBER memory device and a low RBER memory device can vary depending on the technology. In an exemplary embodiment, low RBER DRAM devices have RBERs in the range of about 1E-20 errors per bit and high RBER DRAM devices have RBERs in the range of about 1E-5 errors per bit.

One or more of the embodiments described herein are directed to a one-hundred and twenty-eight byte cache line commonly used on IBM® Power Systems™ servers, however, embodiments can be implemented on any size cache line and on data stored in a location other than cache memory. One or more embodiments could also be implemented with DRAM chips other than x4, such as x8 or x16 by incorporating additional DRAM chips to hold more ECC symbols to extend error correction for the additional symbols errors associated with a chip kill in x8 and x16 DRAM. IBM Power Systems already does this with traditional ECC by adding a tenth x8 DRAM chip to a rank of nine DRAM chips.

In accordance with one or more embodiments of the present invention described herein, a balanced approach is provided that can effectively correct both traditional DRAM hardware errors as well as a significant increase in random symbols errors by leveraging a spare memory device, or memory chip, to minimize the impact of a chip kill or other catastrophic chip hardware fault symbol errors, as well as additional error correcting code (ECC) symbols (when compared to contemporary designs). This approach includes a common decoder for reading data and enhanced performance when a first chip kill (i.e., an entire memory device is marked as faulty) is encountered by having the spare DRAM chip along with additional ECC symbols used to eliminate the constant barrage of corrections associated with the first chip kill event by replacing the failed chip with the spare and recreating the lost data associated with the failed chip. In accordance with one or more embodiments of the present invention, the decoder is designed with fast exit paths so that the low RBER device latency is not impacted. For example, one of the new fast exit paths corrects for random one and two symbol errors is rarely used for low RBER devices, but used very frequently for high RBER devices. In accordance with one or more embodiments of the present invention, the ECC includes additional logic when compared to traditional ECC. The integrated, or common, ECC described herein can handle high numbers of random symbol errors with the traditional ECC that was designed to handle a small number of single soft errors and hard single cell failure along with more significant DRAM hardware failures (e.g. chip kill), with ECC that can effectively handle the deluge of multiple random symbol errors with minimal impact to low RBER device latency.

In accordance with one or more embodiments of the present invention, OpenCAPI memory interface (OMI) DIMMS are implemented. Each DIMM can include one or more ranks of DRAM chips as well as a buffer chip that includes hardware and/or software to control and access the DRAMS to read and write data, and to perform error correction. In accordance with one or more embodiments of the present invention, the error correction logic described herein is located on the buffer chip and can be implemented in hardware and/or software. In accordance with one or more embodiments of the present invention, the buffer chip is not located on the DIMM and it communicates to the DIMM and/or memory devices on the DIMM via one or more busses.

The primary failure modes for contemporary low BER rate memory devices such as the current generation of DDR4 DRAM chips include single cell errors which can manifest themselves as minor hardware defects, and as bit flips due to cosmic rays and alpha particle hits. The frequency of occurrence is dependent on the size of memory installed in the server, but in general these are relatively rare events perhaps at most normally occurring in small numbers each day per system. A background scrubbing mechanism can be used to detect and correct soft errors in the system by reading all address locations looking for soft errors and if it detects an error, the scrubbing attempts to correct it. A full memory scrub on servers such on servers such as IBM Power Systems servers can typically take place a couple of times a day but can be scheduled to occur more or less frequently.

More significant hardware failures include bit line failures where multiple bits from a DRAM chip that map into a single cache line are in error. A "chip kill" is a more catastrophic failure where a significant portion of a DRAM device, or chip, fails, causing all bits read from the chip to be in error. Chip kill failures are normally rare, but they do happen especially across a large population of servers and when encountered cause addition cycles to be incurred in order to correct the data. Since a chip kill causes errors for all the DRAM addresses associated with the rank in which it resides, the additional cycle penalty for correction will occur often, even with memory interleaving enabled and thus can result in performance degradation due to the additional cycles incurred for correction.

RAM is often designed and packaged as pluggable modules so that incremental amounts of storage can be added to the computer based on the specific memory requirements for each system and application. DIMMs are perhaps the most prevalent memory module structure currently in use. DIMMs are thin rectangular cards with several memory chips mounted on the cards, and are usually designed with dynamic memory devices, or chips, that need to be regularly refreshed to prevent the data that they are holding from being lost. Originally, DRAM chips were asynchronous devices, but later generation synchronous DRAM (SDRAM) chips have synchronous interfaces to improve performance. Eventually DDR devices that use pre-fetching along with other speed enhancements to improve memory bandwidth and reduce latency became available. Burst length is the number of bits read or written to each data line (DQ) of a DRAM chip during any access. DDR3 and DDR4 memory devices typically have a standard burst length of eight, and DDR5 memory devices typically have a standard burst length of sixteen.

The size of data storage, including RAMs, HDDs, and SSDs, has continued to grow as computer systems have become more powerful. It is not uncommon at present to have a single computer RAM composed of hundreds of trillions of bits. Without some type of mitigation such as error correction, the failure of just a single RAM bit could cause the entire computer system to fail. An unmitigated hard error, be it either single cell, multi-bit, full chip, or a full DIMM failure can render the system inoperable until it is repaired. Downtime can last hours or perhaps even days before a spare part arrives so that the failure can be repaired. This downtime may have a substantial impact to a business, especially a business that is highly dependent on its computer systems.

Data is stored on physical and electrical devices, and the most catastrophic failures are associated with a full device failure. If all of the data is stored on a single device and the single device fails, then all of the data will be lost and recovery is not possible. Spreading the stored data across multiple physical devices is a strategy that is employed to allow for recovery of lost data by utilizing the remaining data and ECC symbols stored on the still functional devices. The failing device can be a DRAM memory chip on a DIMM (i.e., a "chip kill"), a full DIMM failure, or a HDD failure, each of which will contain a large number of data and ECC symbols. The more data and ECC symbols that are lost during a failure, the more total ECC symbols that are needed to correct and recover the missing data. Careful consideration of the physical structure of the storage system is important to designing the most effective error correction scheme.

The probability of encountering a HDD, SSD, or RAM failure during normal operations has continued to increase due at least in part to increased storage density due to the size of computer memory continuing to grow while at the same time the size of memory devices (e.g., DRAM chips and NAND flash chips) continuing to get smaller. New failure modes such as variable retention time errors have surfaced as smaller circuit sizes approach the brink of physical limits, thus making the need for robust error correction all the more important.

Techniques to detect and correct bit errors have evolved into an elaborate science over the past several decades. One of the most basic detection techniques is the use of odd or even parity, where the bits in a data word are exclusive-ored (XOR-ed) together to produce a parity bit. For example; a data word with an even number of ones will have a parity bit of zero, and a data word with an odd number of ones will have a parity bit of one. If a single bit error occurs in the data word, it can be detected by regenerating parity from the data and then checking to see that it matches the originally generated parity stored with the word.

Richard Hamming recognized that the parity technique could be extended to not only detect errors, but to correct errors by appending a more intricate XOR field, an error-correcting code (ECC) field, to each code word. The ECC field is a combination of different bits in the word XOR-ed together so that errors (small changes to the data word) can be easily detected, pinpointed, and corrected. The number of errors that can be detected and corrected is directly related to the length of the ECC field appended to the data word. One goal is to ensure a minimum separation distance between valid data words and code word combinations. The greater the number of errors being detected and corrected, the longer the ECC field required to ensure minimum separation distance between valid code words. This distance between valid code words is known as the Hamming distance.

Error detection and error correction techniques are also commonly used to restore data in noisy communication transmission media or for storage media where there is a finite probability of data errors due to the physical characteristics of the device. The circuits used to store data as voltage levels representing a one or a zero in a RAM are subject to both device failure and state changes due to high energy cosmic rays and alpha particles. HDDs that store ones and zeros as magnetic fields on a magnetic surface are also subject to imperfections in the magnetic media and other mechanisms that can cause changes in the data pattern from what was originally stored.

In the 1980's, RAM memory device sizes first shrank to the point where the frequency of occurrence of soft errors began to have a noticeable impact on overall system reliability. The latch circuits that hold each bit became sufficiently sensitive to alpha particle impacts and cosmic rays associated with normal background radiation that memory bit flips began to occur fairly regularly. These particles do not damage the device, but do cause transient memory errors. These are known as soft errors and often impact just a single bit. This type of single bit failure can be corrected by simply rewriting the memory location with the correct data or new data.

Memory ECCs, like those proposed by Hamming, use a combination of parity codes in various bit positions of the data word to allow detection and correction of errors. Every time that a data words is written into memory, a new ECC code word is generated and stored with the data allowing detection and correction of the data when the data is read out of memory. The first ECCs applied to RAM devices allowed for double-bit error detection (DED) and single-bit error correction (SEC). In addition to correction of transient errors SEC/DEC ECCs also allow for transparent recovery of single bit permanent hard errors in RAM devices.

In addition, scrubbing routines were also developed to improve ECC effectiveness by helping reduce memory error alignment by using a compliment/re-compliment process to correct soft errors.

HDDs often have embedded checkers such as ECCs that are used to detect bad sectors. Cyclic redundancy checks (CRCs) and longitude redundancy checks (LRCs) may also be employed as embedded checkers in HDD electronics or in conjunction with disk adapters to detect and correct faults. These checkers may also be used by higher levels of code and applications to detect and correct HDD errors. CRCs and LRCs are generated and written coincident with data to help detect data errors. CRCs and LRCs are typically created via hashing functions that produce relatively small and substantially unique bit patterns generated from the data. When the data is read from the HDD, the checksum is regenerated and compared to the checksum stored on the platter, or disk. To ensure that the data retrieved from the magnetic pattern encoded on the disk is error free, these checksum signatures must match exactly, or be identical, to those originally generated and saved on the disk with the data.

Redundant array of independent disk (RAID) systems have been developed to improve performance and/or to increase the availability of disk storage systems. RAID systems distribute data across several independent HDDs. There are many different RAID schemes that have been developed each having different characteristics and different pros and cons associated with them. Performance, availability, and utilization/efficiency (the percentage of the disks that actually hold customer data) are examples of characteristics, or attributes of RAID schemes. The tradeoffs associated with various RAID schemes have to be carefully considered because improvements in one attribute can often result in a worsening of another.

RAID-0 is striping of data across multiple HDDs to improve performance. RAID-1 is mirroring of data, keeping two exact copies of the data on two different HDDs to improve availability and prevent data loss. Some RAID schemes can be used together to gain combined benefits. For example; RAID-10 is both data striping and mirroring across several HDDs in an array to improve both performance and availability. RAID-3, RAID-4, and RAID-5 are very similar in that they use a single XOR checksum to correct for a single data element error. RAID-3 is byte level striping with a dedicated parity HDD, RAID-4 uses block level striping with a dedicated parity HDD, and RAID-5 is block level striping like RAID-4, but with distributed parity. There is no dedicated parity HDD with RAID-5 as parity is distributed substantially uniformly across all the HDDs thus eliminating the dedicated parity HDD as a performance bottle neck. The key attribute of RAID-3, RAID-4, and RAID-5 is that each is capable of correcting a single data element fault when the location of the fault can be pinpointed through some independent means. This capability allows RAID-3, RAID-4 and RAID-5 to correct for a complete HDD failure.

There is some inconsistency and ambiguity in RAID related terminology used throughout the industry. The following definitions are what are implied by use of these terms in this disclosure unless otherwise stated. An "array" is a collection of hard disk drives that hold symbols on which one or more instances of a RAID erasure code is implemented. A "symbol" or an "element" is a fundamental unit of data or parity. These are the building blocks of the erasure codes. For HDDs, symbols are typically held in sets of sequential sectors. An element is composed of a fixed number of bytes. It is also common to define elements as a fixed number of blocks. A "block" too thus represents a fixed number of bytes. A "stripe" is a complete and connected set of data elements and parity elements that are dependently related to the parity computation relations which is calculated across this dependent set of data elements. In coding theory the stripe is the code word or code instance. A "strip" is a segment of the stripe that resides on one physical HDD, and it includes a collection of contiguous elements on a single hard disk drive. A strip contains data elements or parity elements or both from the same disk and stripe. The term strip and column are used interchangeably. In coding theory the strip is associated with the code word and is sometime called the stripe unit. The set of strips in a code word form a stripe. It is most common for strips to contain the same number of elements. In some cases stripes may be grouped together to form a higher level construct know as a "stride."

There is not a single universally accepted industry wide definition for RAID-6. In general, RAID-6 refers to block or byte level striping with dual checksums and it allows for correction of up to two data element faults when the faults can be pinpointed through some independent means. It also has the ability to pinpoint and correct a single failure when the location of the failure is not known. RAID-6 is a specific example of the more general Reed-Solomon error correction codes. These powerful codes have found wide ranging use correcting errors in applications ranging from deep space probes to compact disk errors in digital video disc (DVD) players.

RS-codes are non-binary cyclic codes applied to data elements or symbols. A RS(n, k) code can be defined to have: k=the number of data symbols; m=symbol length in bits; and n=the total number of symbols, where $0<k<n<2^{(m+1)}$. Further defining c=symbol error correcting capability when the location of the error is not determined by an independent means results in n−k=2c. In other words, the difference in the total number of symbols and the number of data symbols is directly proportional to the data correcting capability of the RS-code.

The minimum distance is the number of bit differences between valid code words. As used herein, the term code word refers to a group of data symbols followed by one or more ECC symbols that are read and corrected as a unit. The RS-code achieves the largest possible minimum distance for any linear code. For non-binary codes, the minimum distance analogous to the Hamming distance is given by dmin=n−k−1. Defining e=erasure correcting capability (i.e., ability to correct for faults when the fault location is determined independently), results in e=dmin−1=n−k=2c. In other words, it is possible to correct for only half as many faults when the location of the error is not determined through some independent means and thus the RS code is useful in determining the location and then correcting the error.

RS codes can be thought of as a series of simultaneous equations that can be used to solve for unknowns. These unknowns are either data symbols or the location of the symbols with the fault. RAID-6, for example, uses two equations to generate two independent checksums applied to each data elements in each row. Defining Q(x)=RS checksum where x=a; P(x)=RS checksum where x=1; and d0, d1, . . . , dN=polynomial coefficients results in RS checksum equations having the polynomial form: $Q(x)=d0+d1*x+d2*x^2+\ldots d(N-1)*x^{(N-1)}$. The equation can be used to solve for a coefficient, to correct a data element, or if the location of the fault is unknown it can be used to solve for the power of x to pinpoint the location.

It can be seen that the RAID-3, RAID-4, and RAID-5 simple XOR is a special case where where x=1 so that the equations then becomes: P(x)=d0+d1+d2+ . . . d(N−1). There are many variations of this general equation that can be used. The main requirement is that the equation be a primitive polynomial which means it is analogous to a prime number where it has no common roots. That ensures the solution always map to unique values in a finite field, a Galois field.

In general, contemporary error correction logic is optimized for either high RBER memory devices or for low RBER memory devices which can prevent the same circuit containing the error correction logic from being used for both types of memory devices.

Turning now to FIG. 1A, a contemporary memory system 100 that includes a DIMM 102 is generally shown. The memory system 100 shown in FIG. 1A includes a DIMM 102 containing a buffer device 104, as well as two ranks of sixteen data DRAM or a total of thirty-two data DRAMS 106 for storing data, four ECC DRAMS 108, two per rank for storing ECC and meta-data symbols, and two spare DRAMs 110, one per rank. A traditional ECC design, such as a Reed-Solomon (RS) like symbol correction on byte size symbols can be utilized along with fault marking techniques where the location of a hardware fault such as a chip kill is recorded. Recording, or marking, the location of the failing memory device allows the finite and limited number of ECC symbols to be conserved and more effectively utilized to improve error correction capabilities. The ECC symbols are also referred to herein as "correction information."

As shown in the memory system 100 of FIG. 1A, the error correction logic is designed for a one-hundred and twenty-eight byte cache line that utilizes two ranks of nineteen by four DRAM chips. DDR4×4 DRAM chips typically have a burst length of eight so that each access yields eight nibbles or four symbols of eight bytes. The design is such that a single cell failure will manifest itself as a single symbol error however the number of additional cycles incurred to correct the error will only be incurred when that particular DRAM address is accessed and thus will not have a significant impact on performance. A chip kill will at most impact eight nibbles (four symbols), however correction will be necessary on data for every DRAM address in the rank, so the performance penalty is more pervasive and significant.

The two ECC DRAMS 108 in each rank that hold meta data provide seven ECC symbols (in this example bytes) and one byte used for other purposes (e.g., as a tag that describes attributes of the data). As shown in FIG. 1A, the ECC operates on sixty-four bytes of data at a time, so with seven ECC symbols, three random symbol errors can be located and corrected. Error marking enables correcting for more errors since the location of the error is determined in advance or determined by some other means. Contemporary OMI buffer chips, such as buffer device 104 shown in FIG. 1A, implement a traditional approach aimed a low RBER DRAM devices and performing error corrections such as those described below in reference to FIG. 2.

Turning now to FIG. 1B, a contemporary memory system 130 that includes a DIMM 132 is generally shown. In the memory system 130 of FIG. 1B, a cache line is read by accessing two consecutive reads to a single rank which produces exactly the same amount of data as extracting the cache line from two ranks as shown in FIG. 1A. One notable difference, when compared to two rank approach in the memory system 100 of FIG. 1A, is that a chip kill failure doubles the number of symbols lost in the cache line. The memory system 130 shown in FIG. 1B can also be used with DDR5 DRAM chips with a single read with a burst length of sixteen.

Turning now to FIG. 2, a table 200 of error correcting actions in a contemporary memory system is generally shown. In the example shown in FIG. 1A, where even with a one-hundred and twenty-eight byte cache line the ECC operates on sixty-four bytes of data, it takes four cycles (with one port) to get the data, or code word, to the buffer device 104. As used herein, the term "cycles" refers to clock cycles of a processor, such as a processor located on the buffer device 104 or on a processor requesting the data being read. The table 200 shown in FIG. 2 describes a number of cycles 210 and an estimated frequency of occurrence 212 for three fast path exit points 208: Exit 0 path 202, Exit 1 path 204, and Exit 2 path 206 that are designed to minimize the number of cycles consumed for correction of any detected errors for low RBER memory devices. The three exit points 208 can be implemented, for example, by error correction logic located on a buffer device, such as buffer device 104 on DIMM 102 of FIG. 1A.

The first primary path exit point, Exit 0 path 202, is an error correction logic bypass path that does not consume any additional cycles and assumes that most data does not need to be corrected. For a speculative load, the bypass data is consumed by the requestor (e.g., a core processor). For a non-speculative load, the data is not immediately consumed by the requestor to ensure that the data does not need to be corrected. Thus, some paths through the processing core allow processing of this data to continue, so if no data errors are later detected by the ECC, which is normally the case, performance is improved since no delay in processing is incurred. If an error is later detected, then the pipe line is flushed and good corrected replacement data is fed into the pipe.

Referring to the table 200 of FIG. 2, the next fastest path out of the error correction logic is Exit 1 path 204 which can correct for a single marked chip and up to one additional random symbol error. This requires four ECC symbols for the chip kill correction and another two symbols to locate and correct an accompanying random symbol error. This path, Exit 1 path 204, through the error correction logic takes an additional eight cycles, four cycles to get the data to the buffer device 104 and four cycles to do the correction. As shown in table 200, the frequency of occurrence of a single random symbol error with a mark that can occur for any variety of reasons is relatively small for a low BER DRAM chip. It includes a soft error or a stuck cell or even a bit line error which normally occur no more than a very small number of times daily and probably far less than that.

A chip kill failure is typically relatively rare. With a large population of servers it is often desired to not have to replace a DIMM with a chip kill failure and thus, a spare DRAM chip is used to quickly eliminate the first chip kill failure. When a chip kill is present, the Exit 1 204 path will become the primary path through the error correction logic and consume eight additional cycles only until the spare DRAM is varied in. The performance impact associated with the added eight cycles does not adversely impact long term performance since it is temporary and thus no repair is required for single chip kill failures. In order to minimize the performance impact of a chip kill, the spare chip is varied into the configuration to be used as a replacement for the failing memory device. Once the substitution process is complete and the data recreated and restored to the substitute chip the Exit 1 path 204 through the error correction logic is no longer traversed, and the reading is resumed using the Exit 0 path 202.

For all other error events, the final path out of the error correction logic is the Exit 2 path 206 which employs the full ECC functionality. The Exit 2 path 206 can correct for one unmarked chip kill and up to one additional symbol error. It takes an additional twelve cycles to traverse this path through the error correction logic. This path takes longer because not knowing which memory device, or chip, is defective causes the error correction logic to have to solve for all chip kill combinations in search of a valid solution. The Exit 2 path 206 consumes twelve cycles, four cycles to get the data to the buffer chip and eight cycles to do the correction. The Exit 2 path 206 is used when a chip kill is present and before it is marked. The error correction logic will solve for all possible chip kill scenarios and if one matches, the logic can correct the error and then mark the failing chip so that so that the Exit 1 path 204 can be used from there on (consuming eight cycles instead of twelve) and the spare chip can be varied in for the first chip kill in the rank. If the error correction logic is unable to correct the error, read retries are performed in the hope that a cache line with fewer errors may result.

As a general rule of thumb to get the error locator polynomial for "t" errors and "e" erasures it normally takes e+2t cycles. In general, to be more certain that the correct number of errors have been identified two more syndromes should be processed. However some decoders which are based on the RIBM decoder of Sarwate and Shanbhag process all the syndromes together, and checking that the decoding is complete in fewer cycles can be done by checking that the successive discrepancies are all zero. As used herein, the term "syndrome" refers to a computation made on the received data which is guaranteed to be zero if no errors occurred and otherwise is used to determine the location and value of the error. In a conventional Reed-Solomon decoder, the syndromes are used to compute a polynomial whose roots determine the positions in the received data which are in error. This polynomial is called an error locator polynomial. It is used in conjunction with a second polynomial called the error evaluation polynomial to compute the bits which need to be corrected in that symbol position. In some ECCs the e+2t formula for number of cycles to compute a locator polynomial doesn't apply since the error correction circuitry is implemented by a specialized decoder which doesn't compute a general locator polynomial.

In accordance with one or more embodiments of the present invention, the spare chip is not varied in until a background scrub is performed. This results in incurring the additional cycle penalty longer, but can simplify the hardware logic by having firmware perform the functions of varying in the spare memory device and recreating the data associated with the failed memory device.

Turning now to FIG. 3A, a memory system 300 that includes a DIMM 302 is generally shown in accordance with one or more embodiments of the present invention. The memory system 300 shown in FIG. 3A includes a DIMM 302 containing a buffer device 304, as well as thirty-two data DRAMS 306, sixteen per rank, for storing data, six ECC DRAMS 308, three per rank, for storing ECC (or correction information) and meta-data symbols, and two spare DRAMs 310, one per rank. A traditional ECC design, such as a Reed-Solomon (RS) like symbol correction on byte size symbols can be utilized along with fault marking techniques where the location of a hardware fault such as a chip kill is recorded. Recording, or marking, the location of the failing memory device allows the finite and limited number of ECC symbols to be conserved and more effectively utilized to improve error correction capabilities.

As shown in the memory system 300 of FIG. 3A, the error correction logic is designed for a one-hundred and twenty-eight byte cache line that utilizes two ranks of twenty by four DRAM chips. DDR4×4 DRAM chips typically have a burst length of eight so each access yields eight nibbles or four byte symbols. The design is such that a single cell failure will manifest itself as a single symbol error however the number of additional cycles incurred to correct the error will only be incurred when that particular DRAM address is accessed and thus will not have a significant impact on performance. A chip kill will at most impact eight nibbles (four byte symbols), however correction will be necessary on data for every DRAM address in the rank, so the performance penalty is more pervasive and significant.

The three ECC DRAMS 308 in each rank that hold meta data provide eleven ECC symbols (in this example bytes) and one byte used for other purposes (e.g., as a tag). As shown in FIG. 3A, unlike the traditional ECC this ECC operates on one-hundred and twenty-eight bytes of data at a time to enhance the robustness of the correction by allowing more ECC symbols to operate on the entire cache line, so with twenty-two ECC symbols, seven random symbol errors can easily be located and corrected. In theory, if random symbol errors where the only interest, eleven symbol errors could be located and corrected with twenty-two ECC symbols. Error marking enables correcting for more errors since the location of the error is determined in advance or determined by some other means. In accordance with one or more embodiments, buffer device 304 implements error correction logic that is optimized for both memory devices with low RBERs and memory devices with high RBERs to perform error corrections such as those described below in reference to FIG. 4. In accordance with one or more embodiments of the present invention the ability to support high RBER memory devices is achieved with minimal impact (e.g., to elapsed cycles) to low RBER memory devices.

In accordance with one or more embodiments of the present invention, ECC decoder, or error correction logic, latency with error and erasures can be estimated as follows for DIMM 302 shown in FIG. 3A. With a dual port buffer chip it will take eight cycles for all the data to arrive at the buffer chip from the DRAM devices (four cycles per rank). With a single port buffer chip it will take sixteen cycles for all the data to arrive at the buffer chip. Syndromes are computed as data is acquired with at most one additional cycle, so after eight or nine cycles, the syndromes are calculated. As can be seen, in some embodiments it may require sixteen cycles for all the data to arrive, in which case the total number of cycles for decoding is increased by eight.

In accordance with one or more embodiments, data arrives over eight cycles, there are "e" symbols marked, and it is desired to correct "t" additional errors. To get the error locator polynomial for "t" errors and "e" erasures normally takes e+2t cycles. To gain confidence that the errors have been correctly identified and corrected, two additional syndromes are processed, so assuming a marked chip there will be four symbols for a chip kill and eight symbol errors for a double chip mark for DRAM driver dotting failures (e.g., caused by having a shared data bus between two DRAMs) that can impact both chips. To verify consistency with the next two syndromes, the cycle cost, or number of cycles, is 8+e+2t+2, where 8 is the number of cycles to retrieve the data from the DRAM chips, e is the number of erasures, 2t is the locator polynomial for t errors, and the +2 is the number of cycles after computing the error locator polynomial that it takes to correct the data (to compute and apply the correction to each data position. Thus, the number of cycles is equal to 10+e+2t, and assuming e=8 for a marked double chip, the number of cycles is equal to 18+2t. With no marked chip it is 10+2t which is the total cost cycle cost not just the cost of finding the locator polynomial given the syndromes.

Thus a reasonably conservative estimate of additional cycles is 18+2t with a marked chip and 10+2t with no marked chip to correct t errors. With a decoder that returns the corrected data over several cycles this is the latency from the start of getting the data to when the corrected data is returned. If new chip failure occurs, and there are at most three errors outside the new failing chip, then 8 (failing chip symbols)+3 (other random symbol errors)=11 symbol error corrections can be performed. In this manner, using 10+e+2t results in 10+2(8+3), to handle the errors which would take 10+22=32 cycles. This is just one example of a strategy that can be used and strategies can be employed by other embodiments to correct for additional errors outside of the failing memory device.

In accordance with one more embodiments of the present invention a common low RBER DRAM and high RBER DRAM error correcting logic design strategy/approach is implemented. In accordance with an embodiment, the error correction logic corrects errors for a one-hundred and twenty-eight byte cache line. The data symbols, ECC symbols and other metadata are pulled from two ranks of twenty memory devices where sixteen memory devices hold data, three memory devices hold ECC symbols and metadata, and one memory device is a spare memory device. The additional memory device of ECC symbols per rank is used to mitigate the higher number of bit errors in high RBER memory devices. This structure results in twenty-two ECC symbols and two symbols of metadata to enabling a high RBER DRAM to function reliably, yet does not adversely impact typical low RBER DRAM performance for a buffer device, such as an OMI buffer.

In addition, in accordance with one or more embodiments of the present invention, a single DIMM having the same buffer chip can be used across an entire product line (e.g., low end, midrange, and high end). To enable this, different types of memory devices can have the same connector to the single DIMM. Different cache line sizes can also be supported by exemplary embodiments for example for low RBER DRAMs by providing separate error correction logic on the buffer chip. Current OMI buffer devices have a single port which can cause some inefficiencies that could be resolved with a two port design, however two ports would require a larger buffer chip and a larger buffer chip would not fit on the smaller DIMM form factor. The one port design can necessitate a larger number of cycles to retrieve the full one-hundred and twenty-eight byte cache line that exemplary embodiments of the present invention utilizes, but not so many additional cycles that it dictates a larger buffer chip.

Exemplary embodiments of the present invention can support low RBER DRAMs and operate on sixty-four bytes of data even when one-hundred and twenty-eight byte caches lines are utilized. One or more embodiments of the present invention can also dot outputs of DRAM chips from the two ranks which can result in a chip kill impacting two DRAM chips if the chip driver circuit is impacted by the failure, this can result in an eight byte symbol chip kill error instead of a four byte symbol chip kill error.

Exemplary embodiments of the present invention include a common structure (e.g., common error correction logic) for use with both low RBER DRAM devices and high RBER DRAM devices. The new common error correction logic, when implemented in hardware will require more silicon real estate and is estimated to take about four to eight times the silicon real estate of traditional error correction logic optimized for low RBER DRAM devices.

Turning now to FIG. 3B, a memory system 330 that includes a DIMM 332 is generally shown in accordance with one or more embodiments of the present invention. In the memory system 330 of FIG. 3B, a cache line is read by accessing two consecutive reads to a single rank which produces exactly the same amount of data as extracting the cache line from two ranks as shown in FIG. 3A. One notable difference, when compared to two rank approach in the memory system 300 of FIG. 3A, is that a chip kill failure doubles the number of symbols lost in the cache line. The memory system 330 shown in FIG. 3B can also be used with DDR5 DRAM chips with a single read with a burst length of sixteen.

Turning now to FIG. 4, a table 400 of error correction actions performed by common error correcting logic is generally shown in accordance with one or more embodiments of the present invention. In the example shown in FIG. 1A and FIG. 2, where the ECC operates on sixty-four bytes of data, it takes four cycles (with one port) to get the data, or the codeword, to the buffer device 304. The table 400 shown in FIG. 4 describes a number of cycles 410, an estimated frequency of occurrence for a high RBER DRAM 411, and an estimated frequency of occurrence for a low RBER DRAM 412 for four path exit points 408: Exit 0 path 402, Exit 1 path 404, Exit 2 path 405, and Exit 3 path 406 that are designed to minimize the number of cycles consumed for correction of any detected errors in both high and low RBER DRAMs. In accordance with one or more embodiments of the present invention, the four exit points 408 are implemented by error correction logic located on a buffer device, such as buffer device 304 on DIMM 302 of FIG. 3A.

The primary Exit 0 path 402 is the same as the Exit 0 path 202 described above with respect to FIG. 2. It is a bypass path that does not consume any additional cycles. Here too the assumption is that most data accessed from a high RBER DRAM device has no errors and requires no correction although there will indeed be far more frequent random symbol errors encountered than a low RBER DRAM.

The next fast path exit point 408 shown in FIG. 4 is Exit 1 path 404 which targets correcting the most prevalent of random symbol errors in high RBER DRAMs, a random error in one or two symbols. The error correction logic corrects for single and double symbol errors with no marked memory devices. This correction will add fifteen cycles to the data read including eight cycles to get the data to the buffer chip, six cycles to calculate the syndrome, and one cycle to perform the correction. In accordance with one or more embodiments of the present invention, for each additional syndrome that is calculated an additional cycle is added. The single and double symbol errors associated with a high RBER DRAM will appear at random locations in the one hundred and sixty symbol cache line and thus have to be located when they occur as part of the correction. Assuming a 1E-5 bit error rate, it can be predicted that about twenty one single symbol errors will occur every microsecond on average and about one hundred and thirty double symbol errors will occur every millisecond on average. At these assumed rates, a double or single symbol error is predicted to occur every seventy-five to eighty cycles, which is about an eighteen to twenty percent performance degradation when compared to low RBER DRAMs. This can be reduced to about fourteen percent by using a larger buffer chip with two ports to reduce the time that it takes to get the data, or codeword, to the buffer from eight cycles down to four cycles.

As mention previously, single symbol errors for low RBER DRAMs due to a soft error or stuck cell or even a bit line error typically occur less than a few times a time. Double symbol errors in a cache line are even more rare, so this exit 1 path 404 through the error correction logic will have no impact on low RBER DRAM operation. It can even be argued that exit 1 path 404 improves performance for low RBER DRAMs, however the frequency of occurrence of single and double errors are normally sufficiently rare so the improvement is negligible.

The impact of correcting a single symbol error in accordance with one or more embodiments of the present invention can be calculated as follows. Assume forty one-symbol errors occur each microsecond and a clock speed of three gigahertz (GHz) (so each cycle is 0.3333 nanoseconds). Twenty-one single symbol errors every microsecond is equivalent to about two single symbol errors every one hundred nanoseconds, or one one-symbol error every fifty nanoseconds, or on average one single symbol error every one-hundred and fifty cycles. If fifteen cycles are added in each time a single symbol error is corrected, then it will take about one-hundred and sixty-five cycles to do one-hundred and fifty cycles of error free operation, or about a ten percent degradation over error free operation.

In a similar manner, the impact of correcting a double symbol error in accordance with one or more embodiments of the present invention can be calculated as follows. Assume that one-hundred and thirty two-symbol errors occur in each millisecond and a clock speed of three gigahertz (GHz) (so each cycle is 0.3333 nanoseconds).

One-hundred and thirty two-symbol errors every millisecond is equivalent to 1.3 two-symbol errors every ten microseconds, or one two-symbol error every 7.7 microseconds, or on average one two-symbol error every twenty-thousand cycles. If fifteen cycles are added in each time a two-symbol error is corrected, then it will take about 10,015 cycles to do 10,000 cycles of error free operation, or about a 0.15 percent degradation over error free operation which is negligible.

Referring back to FIG. 4, the next exit point 408 is Exit 2 path 405. As shown in the table 400, exit 2 path 405 is estimated to take twenty-two to twenty-five cycles to do the correction. It is designed to handle one chip kill that is marked and up four additional random symbol errors. For high RBER chips three symbol errors are predicted to occur at about five hundred per second, and four symbol errors are predicted to occur at about ninety per second. This represents about one error every 4.3 million cycles, and adding twenty-two to twenty-five cycles once every 4.3 million cycles in negligible. However, the Exit 2 path 405 also includes the correction for a single marked chip kill. A chip kill occurs rarely, but when it does occur one or more exemplary embodiments of the error correction logic ECC structure will add twenty-two to twenty-five cycles every time the rank is accessed. The twenty-two to twenty-five cycles is two to three times more than the eight cycles required for a single chip kill and a one symbol error as described above in reference to Exit 1 path 204 in FIG. 2 so it does add latency when compared to contemporary approaches to low RBER DRAMs when chip kill occurs. However, the added latency is short lived for the first chip kill since the spare DRAM chip will be automatically varied in to replace the defective chip once it is detected as being defective. It is exceedingly rare to incur a second DRAM failure in a rank, but if one does occur, the twenty-two to twenty-five added cycles will produce a non-negligible performance impact that can only be resolved with a DIMM or memory device replacement.

The impact of correcting three to four symbol errors when a memory device marked (i.e., there is a chip kill) in accordance with one more embodiments of the present invention can be calculated as follows. Assume seven hundred three or four symbol error per second and a clock speed of three GHz (so each cycle is 0.3333 nanoseconds). Seven hundred three or four symbol errors per second is equivalent to seven three or four symbol errors every ten milliseconds, or one three or four symbol error every 1.428 milliseconds, or on average one three or four symbol error every 4.3 million cycles. If ten cycles are added in each time a three or four symbol error is corrected, then the additional time for correction is negligible. However, a chip kill in this path through the error correction logic will be exercised every time the rank is accessed, and the ten cycles required to exercise the chip kill path is two more cycles than required by exit path 1 204 of FIG. 2.

Referring back to FIG. 4, the next exit point 408 is Exit 3 path 406 which handles a single marked chip kill and up to nine additional random symbol errors. This path through the error correction logic will take thirty-two to thirty-five cycles. For high RBER DRAM chips, a five symbol error in a cache line can be estimated to occur one every four to five minutes, and six, seven or eight symbol errors are estimated to be far less frequent so the added cycles are negligible. The additional cycles will not be negligible for a chip kill scenario, but the repeated corrections associated with the first chip kill will quickly be resolved by varying in the spare DRAM chip. In the rare case where a DRAM driver causes an issue with two DRAM chips and we eight symbols require correction (e.g., looks like a double chip kill) then all eight symbols can be corrected by one or more exemplary embodiments of the error correction logic along with up to seven additional random symbol errors which will allow the server to continue to operate however with some non-negligible performance impact so DIMM replacement will be required. In an alternative embodiment where a double eight burst read is done from a single DDR4 rank to extract the full cache line or a single sixteen burst read from a single DDR5 rank is done, the number of symbols in error due to a chip kill will always be eight, double the two rank DDR4 embodiment where four symbols are in error. Like before in this case or when a double chip kill occurs without marking the error correction circuitry can solve for all the possible double chip kills error scenarios to determine which coupled pair has failed.

Figure 5:
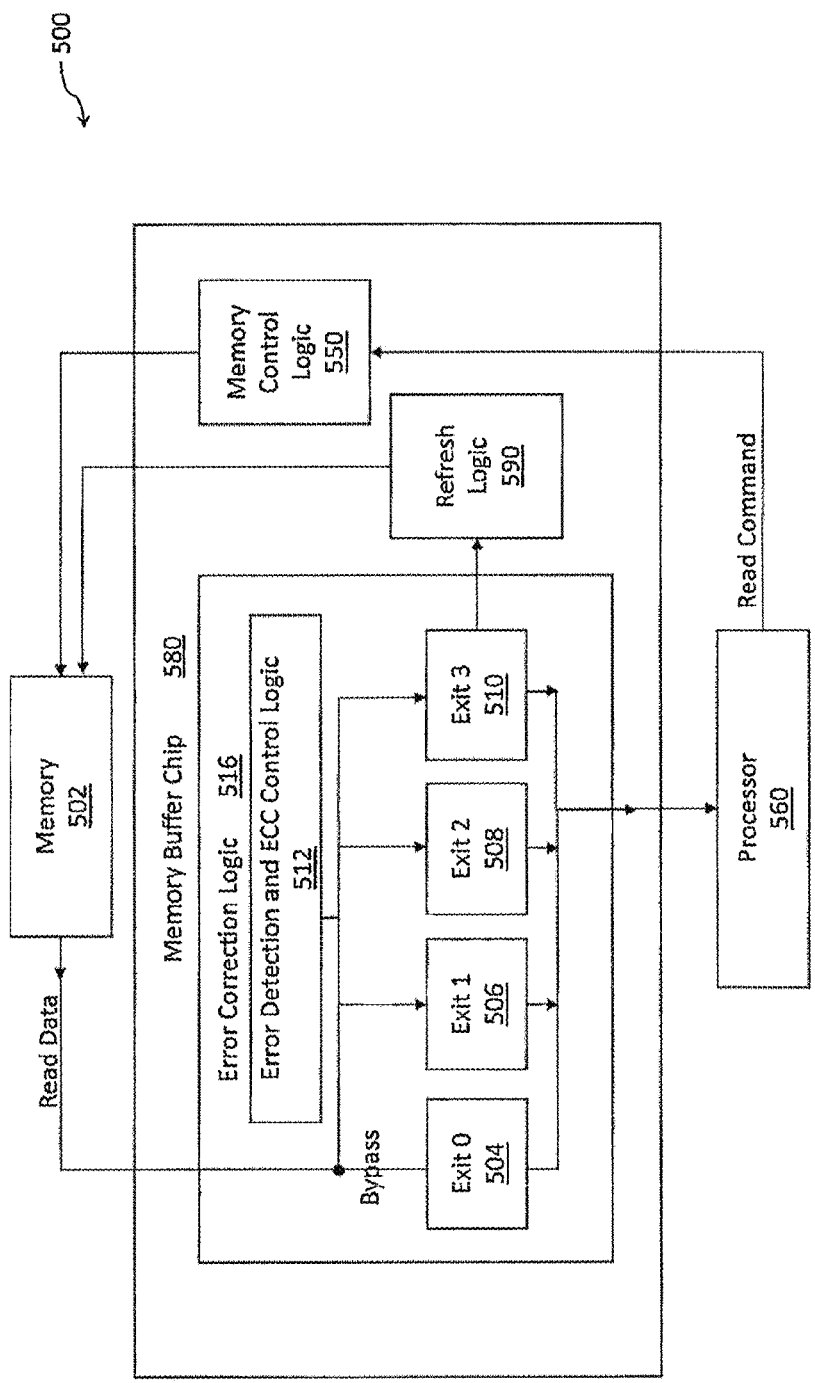
FIG. 5 depicts a block diagram of a memory system that includes an error correcting circuit in accordance with one or more embodiments of the present invention.

Turning now FIG. 5, a block diagram of a memory system 500 that includes an error correcting circuit is generally shown in accordance with one or more embodiments of the present invention. FIG. 5 includes memory 502, error correction logic 516, and processor 560 that is requesting data (the "requestor"). The error correction logic 516 can be implemented by a buffer device, such as buffer device 304 of FIG. 3A. The error correction logic 516 can be implemented by a memory controller for system memory or implemented by a cache controller or other controller for a memory device. Error correction logic 516 includes ECC detection and correction logic 512 (e.g., circuitry) that can correct errors having different complexity levels: one or two random symbol errors; one marked chip kill and up to three to four random symbol errors; and one marked chip kill and nine random symbol errors. The memory buffer chip 580 includes memory control logic 550, one or two random symbol errors correction logic denoted "Exit 1" 506; one marked chip kill and three to four random symbol errors correction logic denoted "Exit 2" 508, and one marked chip kill and nine random symbol errors correction logic denoted "Exit 3" 510.

When a load instruction is issued by the processor 560 and the corresponding memory block (or cache line) is received from the memory 502 it is transmitted to the processor 560 via one of the outputs. The default operation of error correction logic 516 is a bypass mode wherein raw (uncorrected) memory read data is delivered to the processor 560 via a path denoted "Exit 0 Bypass" 504 in FIG. 5. Depending upon the system architecture, the data may travel through one or more buses or interconnects between the error correction logic 516 and the processor 560.

Those skilled in the art will appreciate that more than three correction circuits can be provided, and any error correction codes can be used with the invention.

The computations required to correct one or two symbol errors require less logic and time than the computations required to correct a one marked chip kill and up to four random symbol errors. If the relative latency of the bypass operation is 0, then the latency for one or two symbol error correction will be x, the latency for the one marked chip and up to four random symbol errors will be y, and the latency for the one marked chip and 5-9 random symbol errors will be z, where $x<y<z$. Although execution of a retry read increases latency for this single operation, overall throughput of the memory controller is considerably increased by providing multiple correction outputs and selecting the one output which is required for complete correction at that complexity level but provides minimum added latency.

The memory system shown in FIG. 5 also includes refresh logic 590 to adjust a refresh rate on the DRAMs based at least in part on error conditions detected by common error correction logic 516. As shown in FIG. 5, the common error correction logic 516 is coupled to the refresh logic 590 to share data about the number of errors detected by the common error correction logic. In this manner, data from the common error correction logic 516 can be used to reduce power consumption and improve performance of low RBER memory devices by reducing their refresh rate. The refresh logic 590 shown in FIG. 5 is also coupled to the memory 502 to communicate the adjusted refresh rates of the DRAMs to the memory 502. DRAM suppliers are typically conservative when setting the refresh rate for a memory device so that they can ensure adequate manufacturing chip yield by ensuring adequate operation of even the weaker cells on the DRAM. This allows the DRAM suppliers to meet the demands of DRAM users who often require completely functional DRAM devices with few, if any, bad cells at the time of purchase. As DRAM chip densities continue to increase, the overhead associated with refreshes continues to increase. It has been estimated that sixteen gigabyte DRAMs take as much as an eleven percent performance hit for overhead, much of which is due to refresh.

By combining the common error correction logic 516 with refresh logic 590, DRAM refresh rates can be adjusted automatically while the memory buffer is operational based at least in part on currently observed error rates in the DRAMs. In accordance with one or more embodiments of the present invention, a refresh rate for a DRAM, or memory device, is lowered to the point where a threshold number of bit errors are observed. This threshold number may be a small number. Reducing the refresh rate results in reduced DRAM power usage and improves performance of the overall memory system (e.g., due to less time spent performing refresh). Because symbol error correction requires additional cycles, one approach that may be implemented by one or more embodiments of the present invention is to reduce the refresh rate to a point where a small number of additional symbol errors are detected during cache line access, but many accesses still provide fairly clean cache lines with no symbol errors and thus, no additional cycles needed for correction.

One or more embodiments of the present invention dynamically determine an optimum refresh rate. Individual DRAMs from different batches and from different suppliers exhibit different behavior, so during initial power, or IPL, a series of writes and reads to a DRAM based memory can be performed along with varying the refresh rates to determine an optimum refresh rate setting. These settings can be saved so that this process does not have to be performed every time that the machine is powered off and then powered back on. The next time that the system is powered on the saved refresh settings can be assigned to the memory devices. If memory is added to the system or a DIMM is replaced, the training can be redone for the whole system or for just the memory devices on the new DIMM. The symbol error rate can also be measured during run-time operations and if an error rate threshold is exceeded, the refresh training may be redone and the refresh rates modified accordingly.

In one or more embodiments of the present invention, the refresh training is performed on an individual DRAM device basis. In one or more embodiments of the present invention, the refresh training is performed on banks or sub-arrays within a DRAM device which in some cases may require modifications to contemporary DRAM design.

DRAM suppliers may communicate a refresh rate for DRAM devices used in memory systems that include common error correction logic 516. This allows the power to be reduced with more granular refresh settings for individual DRAM devices, however the performance may still be impacted by the DRAM that requires the highest refresh rate so it may be advantageous to build DIMMs with DRAMs that have similar refresh ranges.

As described herein, the refresh logic 590 automatically adjusts the refresh rate in a DRAM device based at least in part on an observed symbol error rate detected at the memory device by the common error correction logic 516. In accordance with one or more embodiments, the refresh rate is automatically increased during run-time based at least in part on the observed symbol rate being greater than a threshold symbol error rate In accordance with one or more embodiments, the refresh rate is automatically decreased during run-time based at least in part on the observed symbol rate being less than a threshold symbol rate. The refresh rate may be automatically decreased during run-time until the observed symbol error rate is greater than a threshold value, and in response to the observed symbol error rate being greater than the threshold value, the refresh rate is automatically increased to a last value that resulted in the observed symbol error rate being less than the threshold value. In this manner, an optimum refresh rate can be determined.

Figure 6:
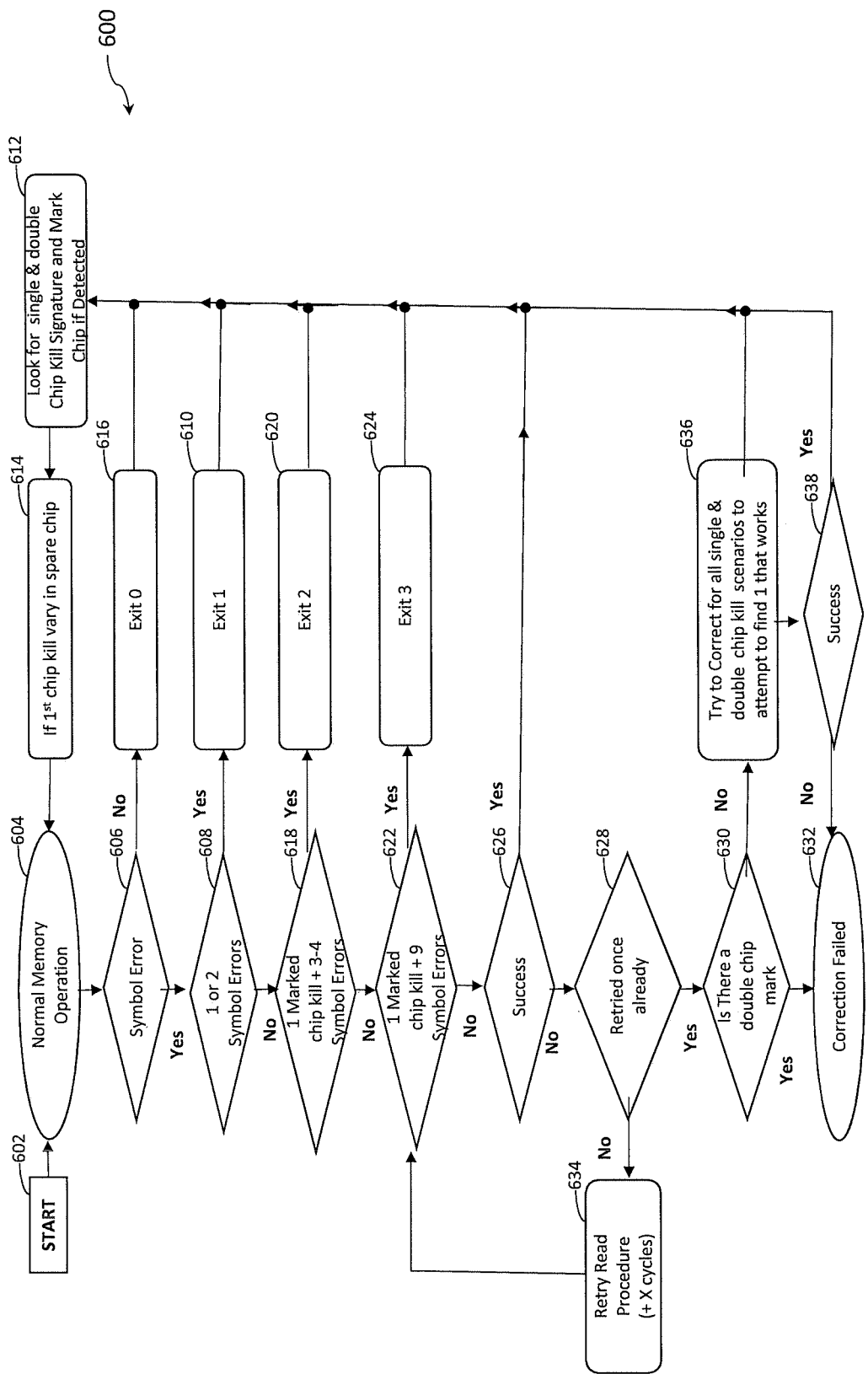
FIG. 6 depicts a flow diagram of a process for reading data from memory in accordance with one or more embodiments of the present invention.

Turning now to FIG. 6, a flow diagram 600 of a process for reading data from memory is generally shown in accordance with one or more embodiments of the present invention. The processing shown in FIG. 6 can be performed by error correction logic, such as error correction logic 516 of FIG. 5. The processing starts at block 602 and normal memory operation to read data is performed at block 604. At block 606 it is determined if there is a symbol error in the data that was read. If there is no symbol error, then processing continues at block 616 in an Exit 0 bypass mode, such as Exit 0 Bypass 504 of FIG. 5.

Next, block 612 is performed to look for single and double chip kill signatures in the syndromes and if either is detected the memory device with the chip kill is marked. Thus, block 612 marks new hardware errors that are found. Processing continues at block 614 where a spare memory device is varied in (used in place of the marked memory device) if a first chip kill was detected in block 614. Normal memory operations continue at block 604.

If it is determined at block 606 that there is a symbol error, then processing continues at block 608 to determine if one or two symbol errors were detected. If the syndromes indicate one or two symbol errors, then processing continues at block 610 in an Exit 1 fast path correction mode, such as Exit 1 506 of FIG. 5. Processing then continues at block 612.

If it is determined at block 608 that there are not one or two symbol errors, then processing continues at block 618 to determine if one memory device is marked as a chip kill and three or four symbol errors were detected. If the syndromes indicate a marked DRAM device and three or four symbol errors, then processing continues at block 620 in an Exit 2 fast path correction mode, such as Exit 2 508 of FIG. 5. Processing then continues at block 612.

If it is determined at block 618 that there is not a marked chip kill and three or four symbol errors, then processing continues at block 622 to determine if one memory device is marked as a chip kill and five to nine symbol errors were detected. If the syndromes indicate a marked DRAM device and five to nine symbol errors, then processing continues at block 624 in an Exit 3 correction mode, such as Exit 3 510 of FIG. 5. Processing then continues at block 612.

If it is determined, at block 622, that there is not a marked chip kill and up to nine symbol errors, then processing continues at block 626 where it is determined whether the correction was successful. If the correction was successful, then processing continues at block 612. If it is determined, at block 626, that the correction was not successful, then processing continues at block 628 to determine if a retry was previously performed. If a retry was not already performed, then processing continues at block 634 to retry the read and attempt correction. The processing in blocks 628 and 634 perform a read retry if correction was unsuccessful. A read retry and attempt at correction is performed with the idea that the cache line may contain fewer errors (e.g., transient errors) if it reread. If this is not the case, the system will also try reading different cache lines associated with the same rank in an attempt to solve for a chip kill with fewer random symbol errors associated with the cache line being read. This can be case if the system can mark the errors, and then read and correct the cache line of interest.

If it is determined, at block 628, that a retry was already performed, then processing continues at block 630, to determine if there is a double chip mark (e.g., a dotted bus error between two DRAM devices). If a double chip mark is detected, then it is marked as a special case of marked hardware (i.e., instead of a chip mark it will be a double chip mark of a DRAM pair). Processing then continues at block 632 with the correction failing as an uncorrectable error. This can cause a checkstop or a machine check on the processor. If it is determined at block 630 that there is not a double chip mark, then processing continues at block 636 where the logic attempts to solve for all double chip kill pairs and if it finds one that corrects the errors it is assumed, at block 638 that it is the correction solution and use it to mark the chip kill pair (it would be extremely unlikely for this to be an accident that it works) at block 612.

If a solution is not found at block 636, then processing continues at block 632 to process the failed correction.

Turning now to FIG. 7, different combinations of data symbols and error correcting code (ECC) symbols 700 are generally shown in accordance with one or more embodiments of the present invention. The estimates of the expected number of symbol errors shown in FIG. 7 are based on the following assumptions: x4 DRAMs are utilized; random equally distributed single bit error rate for high RBER DRAMs is 1E-5 errors/bit; random equally distributed single bit error rate for low RBER DRAMs is 1E-20 errors/bit; 3,680 GB/s memory bandwidth (i.e., 230 GB/s× 16 sockets) or 2.944E13 bits/second; and that 4 ECC symbols are required to correct a x4 chip kill even with a mark.

As can be seen in FIG. 7, with a high RBER device it is not just frequent random single symbol errors that are a challenge, but multi-symbol errors in a single code word are more prevalent and more common which necessitated a completely new ECC structure to mitigate them than what has been used traditionally. Technical improvements provided by one or more embodiments of the present invention described herein include the integration of an ECC that can handle high numbers of random symbol errors with the traditional ECC that was designed to handle a small number of single soft errors and hard single cell failure along with more significant DRAM hardware failures (e.g. chip kill). This common, integrated ECC handles the deluge of multiple random symbol errors with minimal impact to low RBER device latency.

As shown in the row marked 702, when a one-hundred and sixty byte code word is used with a high RBER DRAM, it is projected that that 1 one symbol error will be encountered every microsecond, 130 two symbol errors will be encountered every millisecond, 511 three symbol errors every second, 91 four symbol errors every minute, 308 five symbol errors every hour, 219 six symbol errors every year, 0.36 seven symbol errors every year and 0.52 eight symbol errors every 1,000 years.

The data shown in FIG. 7 is exemplary in nature as the number of cycles for various operations can vary depending on how the hardware is implemented and how best to the ECC is tuned based on variation in RBER from technology to technology.

Figure 8:
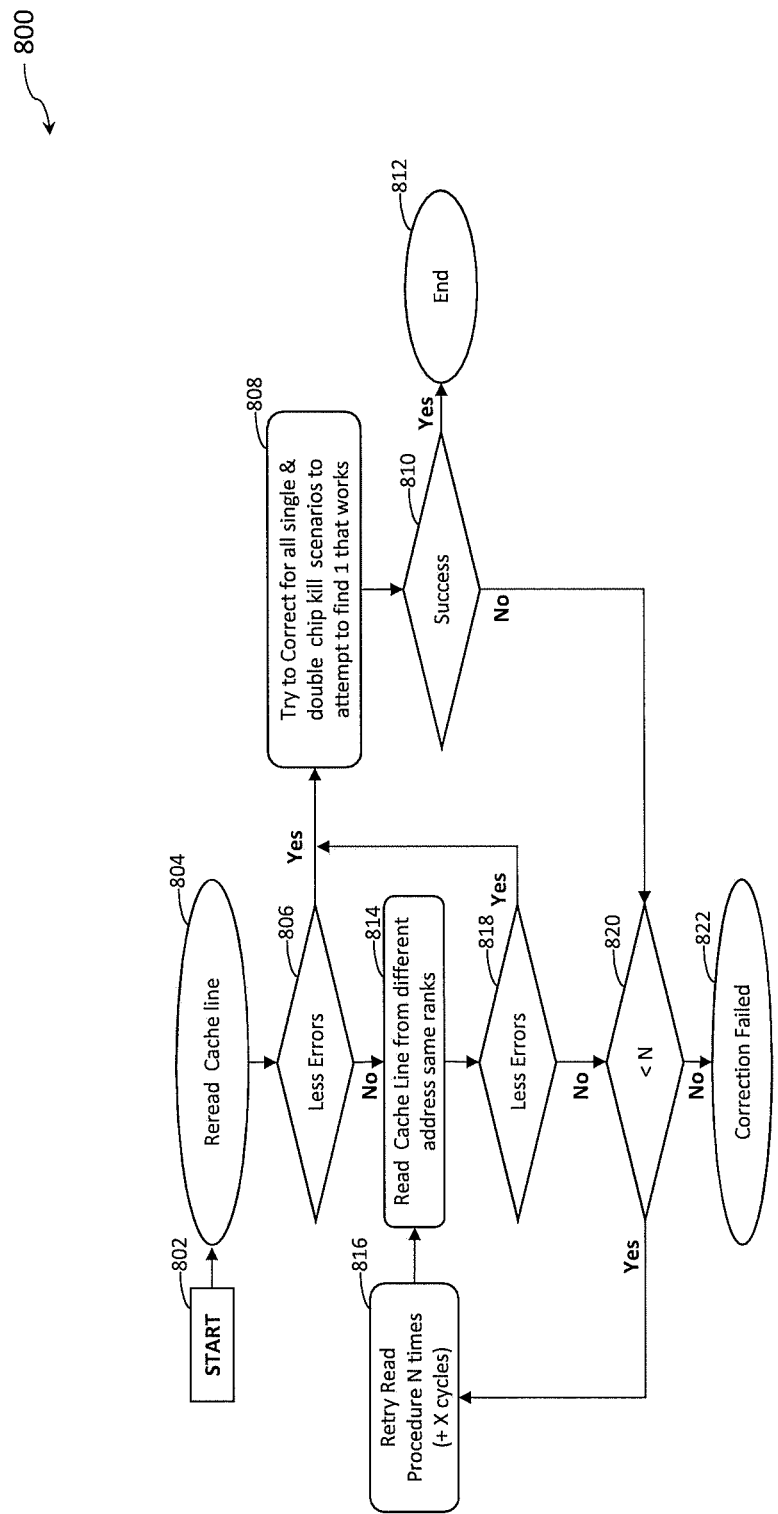
FIG. 8 is a flow diagram of a process for performing a read retry in accordance with one or more embodiments of the present invention.

Turning now to FIG. 8, a flow diagram of a process 800 for performing a read retry, such as read retry block 634 of FIG. 6, is generally shown in accordance with one or more embodiments of the present invention. The processing shown in FIG. 8 can be performed by error correction logic, such as error correction logic 516 of FIG. 5. In an embodiment, the process starts at block 802 where a previous attempt(s) at correction of a read cache line have failed. At block 804, the cache line is re-read and it is determined at block 806 whether the re-read cache line has fewer errors than when it was previously read and unsuccessfully corrected. If there are fewer errors, then processing continues at block 808 where the error correction logic attempts to find a solution to correct for all single and double chip kill scenarios. If a solution was found, as determined at block 810, the processing ends (e.g., returns to block 612 of FIG. 6) at block 812. If a solution as not found, then processing continues at block 820.

If, as determined at block 806, the re-read cache line does not have fewer errors then when it was previously read and unsuccessfully corrected, then processing continues at block 814 where the cache line is read from a different address in the same ranks. Processing continues at block 818 where it is determined whether the cache line read at block 814 has fewer errors than the previously read and unsuccessfully corrected cache line. If there are fewer errors, then processing continues at block 808 where the error correction logic attempts to find a solution to correct for all single and double chip kill scenarios. If a solution was found, as determined at block 810, the processing ends (e.g., returns to block 612 of FIG. 6) at block 812. If a solution as not found, then processing continues at block 820.

If it is determined at block 818, that the cache line read at block 814 does not fewer errors than the previously read and unsuccessfully corrected cache line, processing continues at block 820. At block 820 it is determined if a threshold number (in this example "n") read retries have been performed. If the threshold number of read retries has not been performed, then processing continues at blocks 816 and 814 where the cache line is read from a different address in the same ranks. If the threshold number of read retries has been performed and a solution is not found, then the correction has failed and processing continues at block 822 (e.g., block 632 of FIG. g).

In this manner, if the correction fails the cache line will be re-read and if that doesn't work, the process tries re-reading from different addresses in an attempt to solve for the chip kill or double chip kill. This approach can work because different addresses may have fewer symbol errors accompanying the chip kill symbol errors which would then potentially enable correction of the errors associated with the address accompanying errors.

Figure 9:
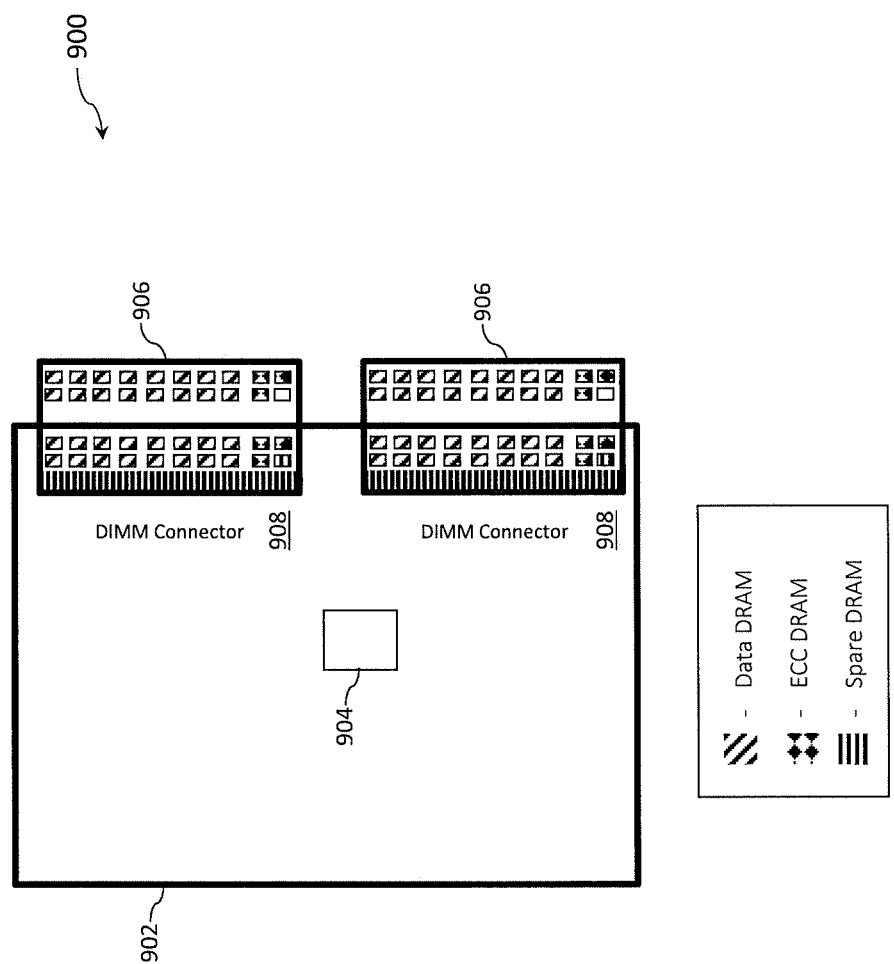
FIG. 9 depicts a block diagram of a memory system that includes error correction logic in accordance with one or more embodiments of the present invention.

Turning now to FIG. 9, a block diagram of a memory system 900 that includes error correction logic is generally shown in accordance with one or more embodiments of the present invention. The memory system 900 shown in FIG. 9 includes x4 DRAM DIMMs 906 that plug into DIMM connectors 908 on a planar board 902. The processing performed by memory system 900 is similar to that discussed previously (e.g., with respect to memory system 300 of FIG. 3A), however the error correction logic is located in a buffer device 904 on the planar board 902 and shared by the DIMMs 906. In accordance with one or more embodiments of the present invention, each DIMM 906 in memory system 900 includes thirty-two data DRAMS for storing data, six ECC DRAMs for storing ECC checksums and meta-data symbols, and two spare DRAMs to correct up to fifteen symbols in a one-hundred and twenty-eight byte cache line. The memory system 900 shown in FIG. 9 allows for simpler DIMMs to be utilized by moving the error correction logic from the DIMMs (as shown in FIG. 3A) to the planar board 902.

Figure 10:
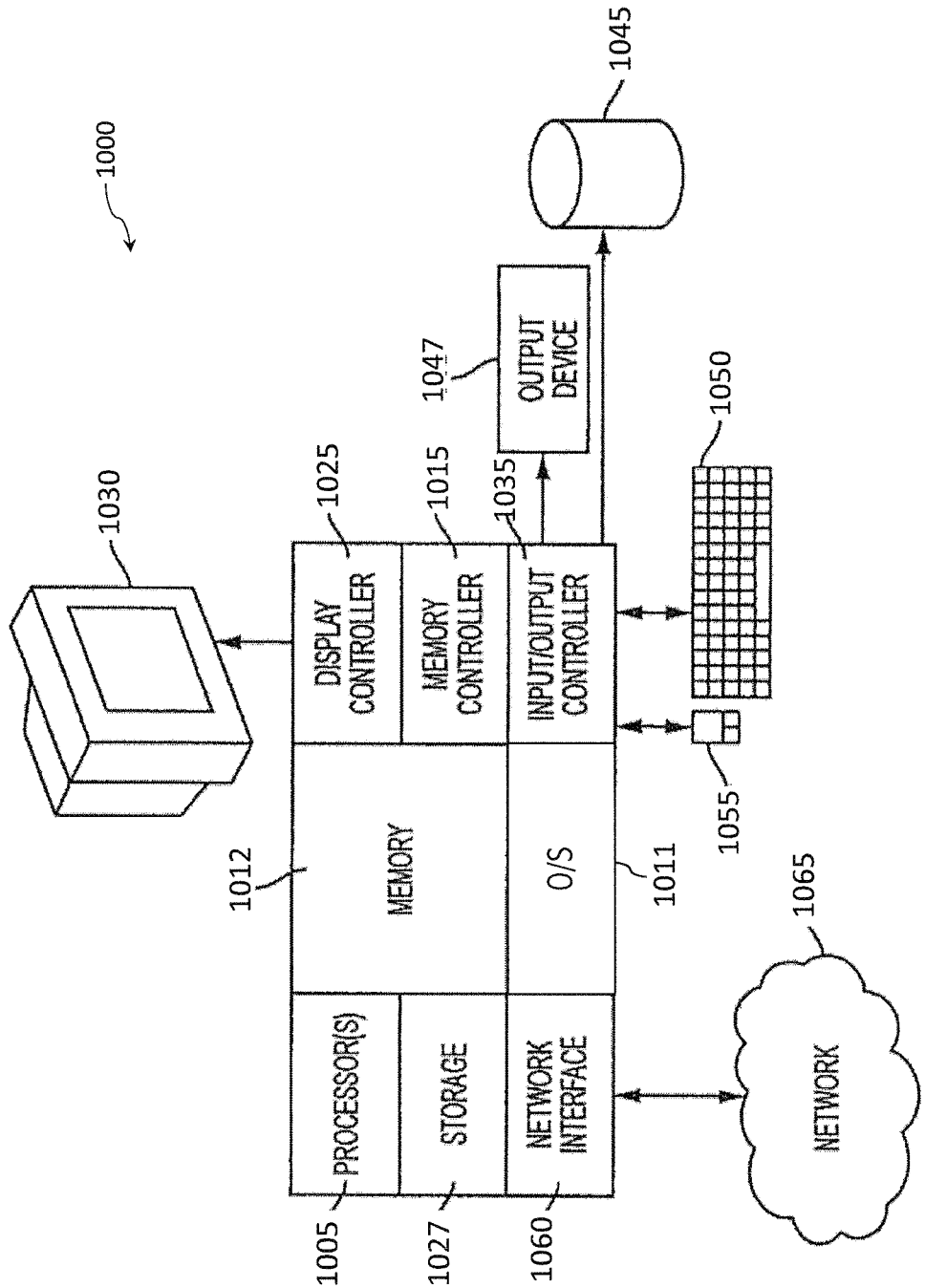
FIG. 10 is a block diagram of a computer system for implementing some or all aspects of providing common high and low random bit error correction logic in accordance with one or more embodiments of the present invention.

Turning now to FIG. 10, a block diagram of a computer system 1000 for implementing some or all aspects of providing common high and low random bit error correction is generally shown in accordance with one or more embodiments of the present invention. The processing described herein may be implemented in hardware, software (e.g., firmware), or a combination thereof. In an exemplary embodiment, the methods described may be implemented, at least in part, in hardware and may be part of the microprocessor of a special or general-purpose computer system 1000, such as a mobile device, personal computer, workstation, minicomputer, or mainframe computer.

In an exemplary embodiment, as shown in FIG. 10, the computer system 1000 includes a processor 1005, memory 1012 coupled to a memory controller 1015, and one or more input devices 1045 and/or output devices 1047, such as peripherals that are communicatively coupled via a local I/O controller 1035. These devices 1047 and 1045 may include, for example, a printer, a scanner, a microphone, and the like. A conventional keyboard 1050 and mouse 1055 may be coupled to the I/O controller 1035. The I/O controller 1035 may be, for example, one or more buses or other wired or wireless connections, as are known in the art. The I/O controller 1035 may have additional elements, which are omitted for simplicity, such as controllers, buffers (caches), drivers, repeaters, and receivers, to enable communications.

The I/O devices 1047, 1045 may further include devices that communicate both inputs and outputs, for instance disk and tape storage, a network interface card (NIC) or modulator/demodulator (for accessing other files, devices, systems, or a network), a radio frequency (RF) or other transceiver, a telephonic interface, a bridge, a router, and the like.

The processor 1005 is a hardware device for executing hardware instructions or software, particularly those stored in memory 1012. The processor 1005 may be a custom made or commercially available processor, a central processing unit (CPU), an auxiliary processor among several processors associated with the computer system 1000, a semiconductor based microprocessor (in the form of a microchip or chip set), a microprocessor, or other device for executing instructions. The processor 1005 can include a cache such as, but not limited to, an instruction cache to speed up executable instruction fetch, a data cache to speed up data fetch and store, and a translation look-aside buffer (TLB) used to speed up virtual-to-physical address translation for both executable instructions and data. The cache may be organized as a hierarchy of more cache levels (L1, L2, etc.).

The memory 1012 may include one or combinations of volatile memory elements (e.g., random access memory, RAM, such as DRAM, SRAM, SDRAM, etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 1012 may incorporate electronic, magnetic, optical, or other types of storage media. Note that the memory 1012 may have a distributed architecture, where various components are situated remote from one another but may be accessed by the processor 1005.

The instructions in memory 1012 may include one or more separate programs, each of which comprises an ordered listing of executable instructions for implementing logical functions. In the example of FIG. 10, the instructions in the memory 1012 include a suitable operating system (OS) 1011. The operating system 1011 essentially may control the execution of other computer programs and provides scheduling, input-output control, file and data management, memory management, and communication control and related services.

Additional data, including, for example, instructions for the processor 1005 or other retrievable information, may be stored in storage 1027, which may be a storage device such as a hard disk drive or solid state drive. The stored instructions in memory 1012 or in storage 1027 may include those enabling the processor to execute one or more aspects of the dispatch systems and methods of this disclosure.

The computer system 1000 may further include a display controller 1025 coupled to a display 1030. In an exemplary embodiment, the computer system 1000 may further include a network interface 1060 for coupling to a network 1065. The network 1065 may be an IP-based network for communication between the computer system 1000 and an external server, client and the like via a broadband connection. The network 1065 transmits and receives data between the computer system 1000 and external systems. In an exemplary embodiment, the network 1065 may be a managed IP network administered by a service provider. The network 1065 may be implemented in a wireless fashion, e.g., using wireless protocols and technologies, such as WiFi, WiMax, etc. The network 1065 may also be a packet-switched network such as a local area network, wide area network, metropolitan area network, the Internet, or other similar type of network environment. The network 1065 may be a fixed wireless network, a wireless local area network (LAN), a wireless wide area network (WAN) a personal area network (PAN), a virtual private network (VPN), intranet or other suitable network system and may include equipment for receiving and transmitting signals.

Systems and methods for providing common high and low random bit error correction as described herein can be embodied, in whole or in part, in computer program products or in computer systems 1000, such as that illustrated in FIG. 10.

Embodiments of the present invention include methods, systems, and computer program products for providing common high and low random bit error correction logic. A non-limiting example system includes a memory system that includes a memory module that includes a plurality of memory devices and a memory buffer device. Each of the plurality of memory devices is characterized as one of a high random bit error rate (RBER) memory device and a low RBER memory device. The memory buffer device includes a read data interface configured to receive data read from a memory address corresponding to a location on a memory device of the plurality of memory devices. The memory buffer device also includes common error correction logic configured to detect and correct error conditions in data read from both high RBER memory devices and low RBER memory devices. The common error correction logic includes a plurality of error correction units which provide different complexity levels of error correction and have different latencies. The plurality of error correction units includes a first fast path error correction unit for isolating and correcting random symbol errors. A latency of the first fast path error correction unit is less than a latency of an other of the plurality of error correction units. Advantages can include the ability to use the same error correction logic (e.g., circuit) for both high RBER memory devices and low RBER memory devices. The combined circuit can minimize a performance impact of error checking and correcting for both memory devices that exhibit high RBERs as well as memory devices that exhibit low RBERs by providing a fast path error correction unit.

In addition to one or more of the features described above or below, or as an alternative, further embodiments may include the common error correction logic further including a bypass path for transmitting data received at the read data interface directly to a requestor of the data, the bypass path having a bypass latency less than the latency of the first fast path error correction unit. Advantages can include the ability to provide a path that does not add any latency to a read cycle unless the read data exhibits errors.

In addition to one or more of the features described above or below, or as an alternative, further embodiments may include the plurality of error correction units further including a second fast path error correction unit configured for isolating and correcting a failing memory device of the plurality of memory devices along with random symbol errors, a latency of the second fast path error correction unit higher than the latency of the first fast path error correction unit. Advantages can include the ability to minimize a performance impact of error checking and correcting for a failing memory device by providing a fast path error correction unit that handles a failing memory device along with random symbol errors.

In addition to one or more of the features described above or below, or as an alternative, further embodiments may include varying in a spare memory device to replace the failing memory device. Advantages can include enhanced availability by providing a spare memory device in place of the failing memory device. Advantages can also include the ability to minimize a performance impact for future reads by removing the corrections required for a failing memory device.

In addition to one or more of the features described above or below, or as an alternative, further embodiments may include the second fast path error correction unit being configured to isolate and correct for two failing memory devices. Advantages can include the ability to minimize a performance impact of error checking and correcting for two failing memory devices by providing a fast path error correction unit that handles two failing memory devices.

In addition to one or more of the features described above or below, or as an alternative, further embodiments may include the common error correction logic further including read re-try logic configured to request read data from an other memory address to isolate a failing memory device by eliminating at least one random symbol error. Advantages can include improved error correction capabilities due to the ability to filter out random symbol errors.

In addition to one or more of the features described above or below, or as an alternative, further embodiments may include the received data include one-hundred and twenty-eight data symbols and twenty-two error correction code (ECC) symbols, and the first fast path error correction unit isolates and corrects random symbol errors in up to two of the one-hundred and twenty-eight data symbols.

In addition to one or more of the features described above or below, or as an alternative, further embodiments may include the plurality of correction units further including a second fast path error correction unit configured to isolate and correct a failing memory device and a random symbol error in up to four data symbols, and a third error correction unit configured to isolate and correct a failing memory device and random bit errors in up to nine data symbols. A latency of the second fast path error correction unit is longer than the latency of the first fast path error correction unit and less than a latency of the third error correction unit.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory system comprising:
   a memory module including:
   a plurality of memory devices, each of the plurality of memory devices assigned a refresh rate, and each of the plurality of memory devices either a high random bit error rate (RBER) memory device or a low RBER memory device; and
   a memory buffer device including a memory having computer readable instructions, the computer readable instructions controlling the memory buffer device to perform:
   receiving data read from a memory address corresponding to a location on a memory device of the plurality of memory devices;
   detecting and correcting error conditions in data read from the memory device, the detecting and correcting performed by common error correction logic that detects and corrects error conditions in data read from both high RBER memory devices and low RBER memory devices; and
   adjusting a refresh rate of the memory device based at least in part on the detected error conditions.

2. The memory system of claim 1, wherein the common error correction logic comprises a plurality of error correction units which provide different complexity levels of error correction and have different latencies, the plurality of error correction units comprising a first fast path error correction unit for isolating and correcting random symbol errors, wherein a latency of the first fast path error correction unit is less than a latency of at least one other error correction unit in the plurality of correction units.

3. The memory system of claim 1, wherein the adjusting is further based at least in part on whether the memory device is a high RBER memory device or a low RBER memory device.

4. The memory system of claim 1, wherein each of the plurality of memory devices are assigned a refresh rate during an initial program load (IPL) of the memory system.

5. The memory system of claim 4, wherein the memory buffer device stores adjusted refresh rates in persistent storage for the plurality of memory devices and the refresh rates assigned during an IPL of the memory system are the stored adjusted refresh rates.

6. The memory system of claim 1, wherein the assigned refresh rates are based at least in part on manufacturer specifications.

7. The memory system of claim 1, wherein the refresh rate of the memory device is automatically adjusted based at least in part on an observed symbol error rate detected at the memory device by the common error correction logic.

8. The memory system of claim 7, wherein the refresh rate is automatically increased during run-time based at least in part on the observed symbol rate being greater than a threshold symbol error rate.

9. The memory system of claim 7, wherein the refresh rate is automatically decreased during run-time based at least in part on the observed symbol rate being less than a threshold symbol rate.

10. The memory system of claim 9, wherein the refresh rate is automatically decreased during run-time until the observed symbol error rate is greater than a threshold value, and in response to the observed symbol error rate being greater than the threshold value, the refresh rate is automatically increased to a last value that resulted in the observed symbol error rate being less than the threshold value.

11. The memory system of claim 1, wherein the memory device is in a bank with one or more other memory devices of the plurality of memory devices and the refresh rate is based at least in part on the error conditions detected by the common error correction logic in the memory devices in the bank, wherein the memory devices in the bank are adjusted to have the same refresh rate.

12. The memory system of claim 1, wherein the memory device is in a sub-array with one or more other memory devices of the plurality of memory devices and the refresh rate is based at least in part on the error conditions detected by the common error correction logic in the memory devices in the sub-array, wherein the memory devices in the sub-array are adjusted to have the same refresh rate.

13. The memory system of claim 1, wherein the memory device is spared out based at least in part on the memory devices having a refresh rate over a threshold refresh rate.

14. A memory buffer device comprising:
   a memory having computer readable instructions, the computer readable instructions controlling the memory buffer device to perform:
   receiving data read from a memory address corresponding to a location on one of a plurality of memory devices, each of the plurality of memory devices assigned a refresh rate, and each of the plurality of memory devices either a high random bit error rate (RBER) memory device or a low RBER memory device;
   detecting and correcting error conditions in data read from the memory device, the detecting and correcting performed by common error condition logic that detects and corrects error conditions in data read from both high RBER memory devices and low RBER memory devices; and
   adjusting a refresh rate of the memory device based at least in part on the detected error conditions.

15. The memory buffer of claim 14, wherein the common error correction logic comprises a plurality of error correction units which provide different complexity levels of error correction and have different latencies, the plurality of error correction units comprising a first fast path error correction unit for isolating and correcting random symbol errors, wherein a latency of the first fast path error correction unit is less than a latency of at least one other error correction unit in the plurality of correction units.

16. The memory buffer device of claim 14, wherein the adjusting is further based at least in part on whether the memory device is a high RBER memory device or a low RBER memory device.

17. The memory buffer device of claim 14, wherein the refresh rate in the memory device is automatically adjusted based at least in part on an observed symbol error rate detected at the memory device by the common error correction logic.

18. The memory buffer device of claim 17, wherein the refresh rate is automatically increased during run-time based at least in part on the observed symbol rate being greater than a first threshold symbol error rate, and the refresh rate is automatically decreased during run-time based at least in part on the observed symbol rate being less than a second threshold symbol rate.

19. The memory buffer device of claim 14, wherein the memory device is in a bank with one or more other memory devices of the plurality of memory devices and the refresh rate is based at least in part on the error conditions detected by the common error correction logic in the memory devices in the bank, wherein the memory devices in the bank are adjusted to have the same refresh rate.

20. A method comprising:
receiving data read from a memory address corresponding to a location on one of a plurality of memory devices coupled to a memory module, each of the plurality of memory devices assigned a refresh rate, and each of the plurality of memory devices either a high random bit error rate (RBER) memory device or a low RBER memory device;
executing common error correction logic using the received data as input to generate corrected data, the common error correction logic configured to detect and correct error conditions in both high random symbol error rate (RBER) memory devices and low RBER memory devices;
executing refresh rate logic configured to adjust a refresh rate of the memory device based at least in part on the error conditions detected by the common error correction logic; and
outputting the corrected data to a requestor of the data.

* * * * *